(12) United States Patent
Nair et al.

(10) Patent No.: US 11,563,011 B2
(45) Date of Patent: Jan. 24, 2023

(54) INTEGRATED CIRCUITRY, MEMORY CIRCUITRY, METHOD USED IN FORMING INTEGRATED CIRCUITRY, AND METHOD USED IN FORMING MEMORY CIRCUITRY

(71) Applicant: Micron Technology, Inc., Boise, ID (US)

(72) Inventors: Vinay Nair, Boise, ID (US); Silvia Borsari, Boise, ID (US); Ryan L. Meyer, Boise, ID (US); Russell A. Benson, Boise, ID (US); Yi Fang Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 126 days.

(21) Appl. No.: 17/038,799

(22) Filed: Sep. 30, 2020

(65) Prior Publication Data
US 2022/0102348 A1 Mar. 31, 2022

(51) Int. Cl.
*H01L 27/108* (2006.01)
*G11C 5/10* (2006.01)
*G11C 11/402* (2006.01)

(52) U.S. Cl.
CPC ............ *H01L 27/1085* (2013.01); *G11C 5/10* (2013.01); *G11C 11/4023* (2013.01); *H01L 27/10805* (2013.01); *H01L 27/10873* (2013.01)

(58) Field of Classification Search
None
See application file for complete search history.

(56) References Cited

U.S. PATENT DOCUMENTS

2012/0228640 A1* 9/2012 Masuda .............. H01L 29/0696
438/510

* cited by examiner

*Primary Examiner* — Nicholas J Tobergte
*Assistant Examiner* — Kevin Quinto
(74) *Attorney, Agent, or Firm* — Wells St. John P.S.

(57) ABSTRACT

A method used in forming integrated circuitry comprises forming conductive material over a substrate. The conductive material is patterned into a conductive line that is horizontally longitudinally elongated. The conductive material is vertically recessed in longitudinally-spaced first regions of the conductive line to form longitudinally-spaced conductive pillars that individually are in individual longitudinally-spaced second regions that longitudinally-alternate with the longitudinally-spaced first regions along the conductive line. The conductive pillars project vertically relative to the conductive material in the longitudinally-spaced and vertically-recessed first regions of the conductive line. Electronic components are formed directly above the conductive pillars. Individual of the electronic components are directly electrically coupled to individual of the conductive pillars. Additional methods, including structure independent of method, are disclosed.

28 Claims, 9 Drawing Sheets

INTEGRATED CIRCUITRY, MEMORY CIRCUITRY, METHOD USED IN FORMING INTEGRATED CIRCUITRY, AND METHOD USED IN FORMING MEMORY CIRCUITRY

TECHNICAL FIELD

Embodiments disclosed herein pertain to integrated circuitry, to memory circuitry, to methods used in forming integrated circuitry, and to methods used in forming integrated circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines, gatelines, or gate lines) The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

Capacitors and transistors may of course be used in integrated circuitry other than memory circuitry.

Some conductive lines of integrated circuitry, for example digitlines as referred to above, are longitudinally elongated horizontally. Electronic components, for example field effect transistors of memory cells, may be directly electrically coupled longitudinally along a conductive line.

DETAILED DESCRIPTION OF EXAMPLE EMBODIMENTS

Embodiments of the invention include methods used in forming integrated circuitry, for example memory circuitry, and integrated circuitry independent of method of manufacture. Example method embodiments of forming memory integrated circuitry are initially described with reference to FIGS. 1-23.

Figure 1:
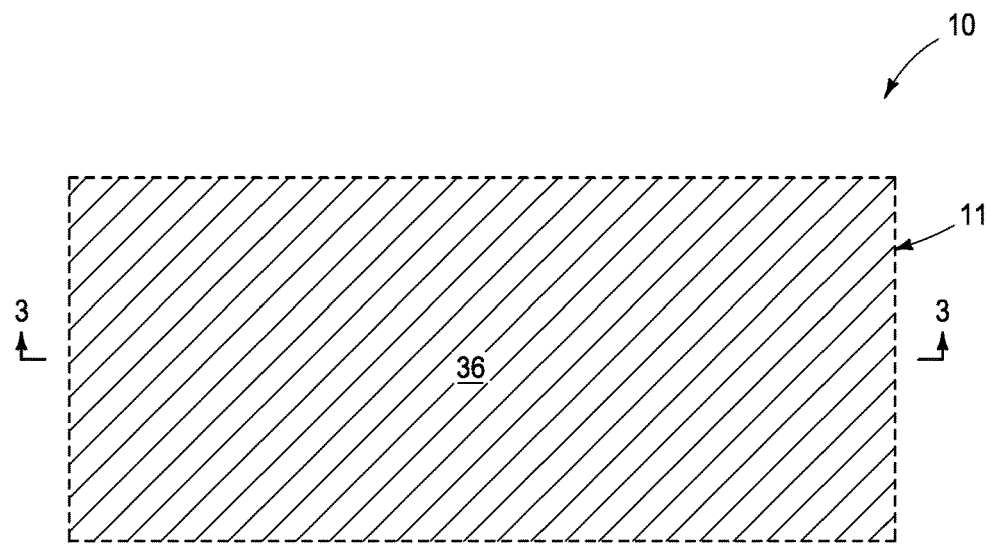
FIG. 1 is a diagrammatic section view of a portion of a substrate in process in accordance with an embodiment of the invention and is taken through line 1-1 in FIG. 3.
Figure 2:
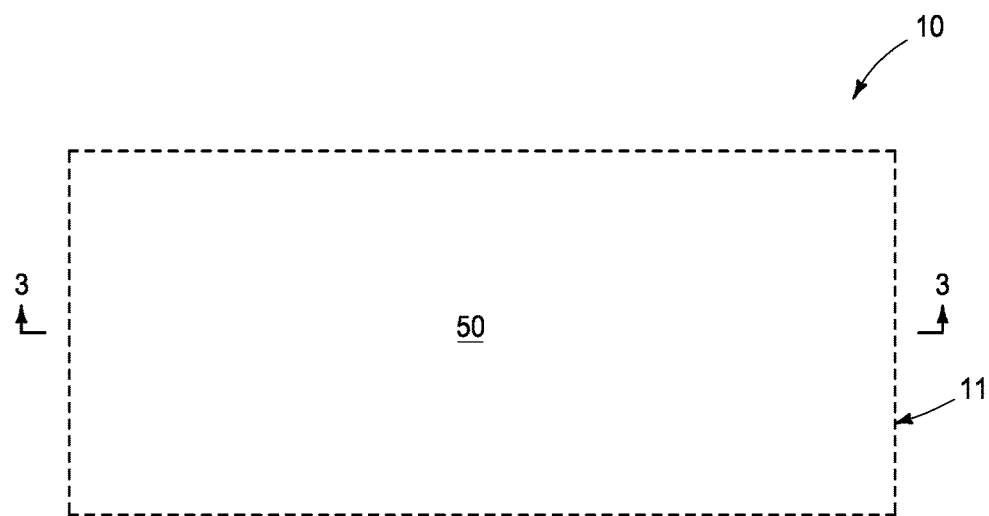
FIG. 2 is a section view taken through line 2-2 in FIG. 3.
Figure 3:
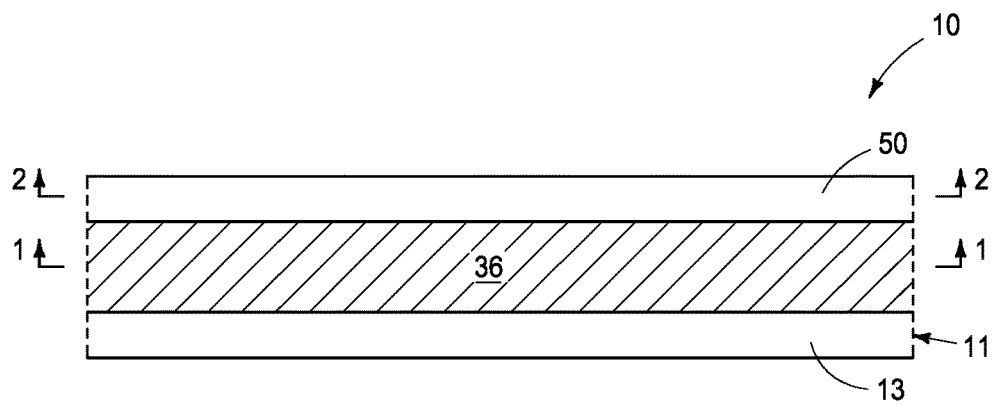
FIG. 3 is a section view taken through line 3-3 in FIGS. 1 and 2.

Referring to FIGS. 1-3, such show a portion of a substrate construction 10 comprising a base substrate 11 comprising any one or more of conductive/conductor/conducting, semi-conductive/semiconductor/semiconducting, and insulative/insulator/insulating (i.e., electrically herein) materials. Various materials may be formed elevationally over and within base substrate 11. Materials may be aside, elevationally inward, or elevationally outward of the FIGS. 1-3-depicted materials. For example, other partially or wholly fabricated components of integrated circuitry may be provided somewhere above, about, or within base substrate 11. With respect to memory circuitry, control and/or other peripheral circuitry for operating components within an array of memory cells may also be fabricated and may or may not be wholly or partially within an array or sub-array. Further, multiple sub-arrays may also be fabricated and operated independently, in tandem, or otherwise relative one another. As used in this document, a "sub-array" may also be considered as an array.

Example base substrate 11 is shown as comprising insulating material 13 (e.g., silicon nitride and/or silicon dioxide), conductive material 36 (e.g., conductively-doped semiconductive material and/or metal material) formed over insulative material 13, and insulator material 50 (e.g., silicon nitride and/or silicon dioxide) formed over conductive material 36.

Figure 4:
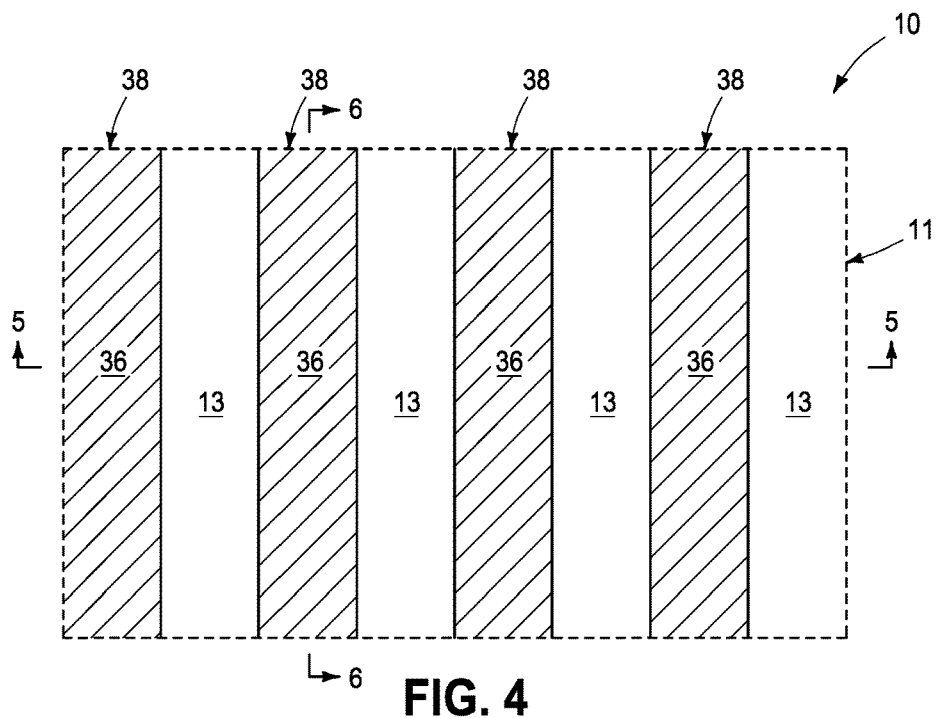
FIGS. 4-23 and 25-27 are diagrammatic sequential sectional, expanded, enlarged, and/or partial views of the construction of FIGS. 1-3, or portions thereof, in process in accordance with some embodiments of the invention.
Figure 5:
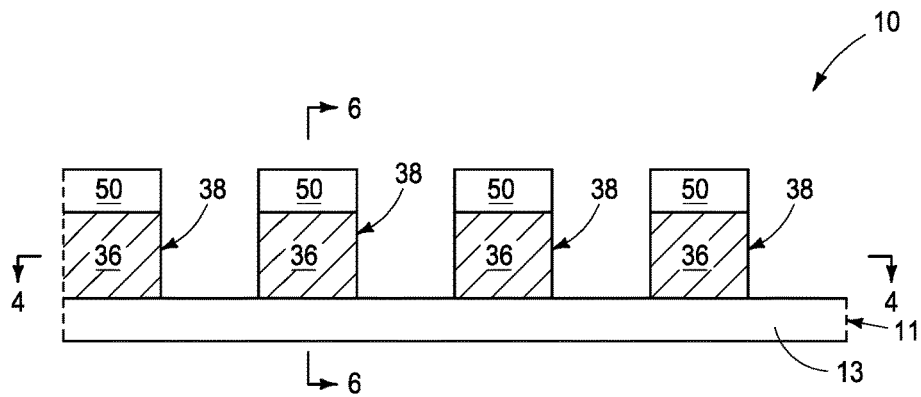
Figure 6:
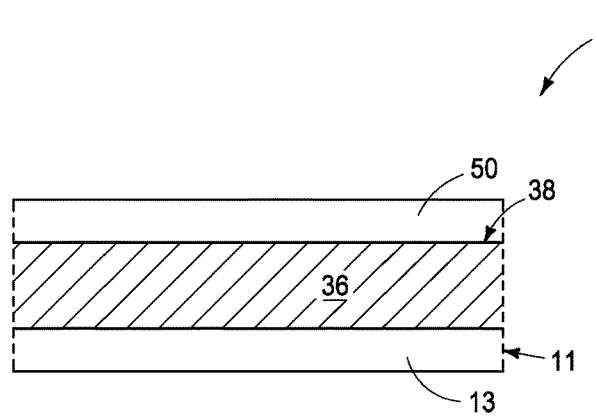

Referring to FIGS. 4-6, conductive material 36 has been patterned into a conductive line 38 that is horizontally longitudinally elongated. Multiple conductive lines 38 are shown as having been formed, although method and structure embodiments herein also contemplate a single conductive line, Conductive line(s) 38 may be patterned using any existing or future-developed techniques, and with or without pitch multiplication. Photolithographic patterning and etch is but one example. Insulator material 50 when present may also be so-patterned as shown.

Figure 7:
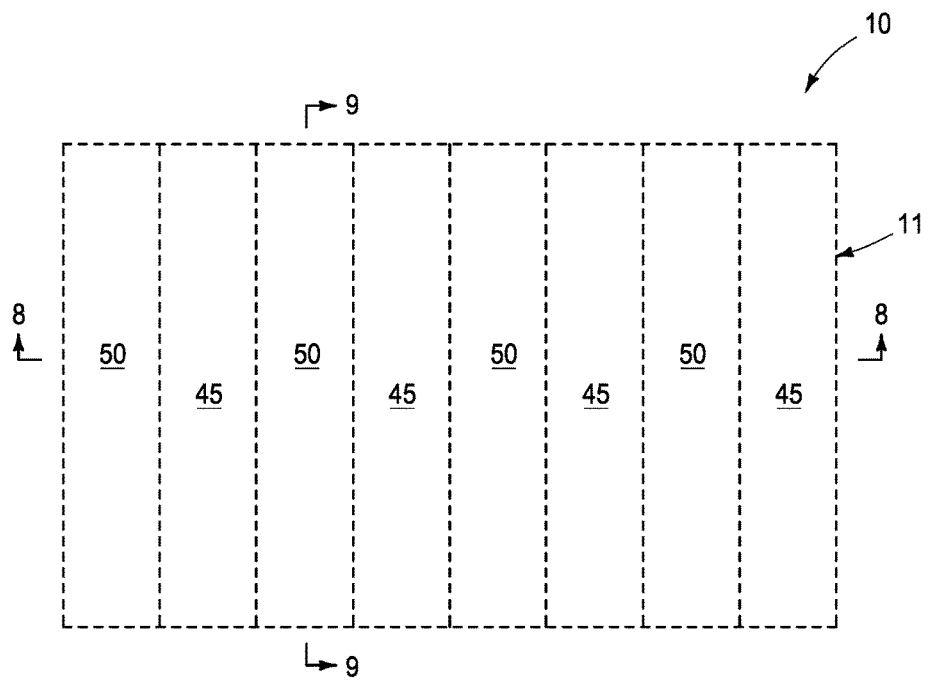
Figure 8:
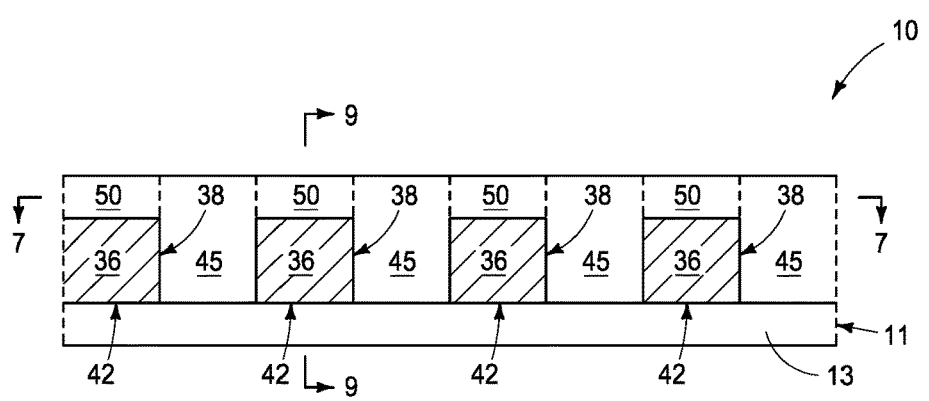
Figure 9:
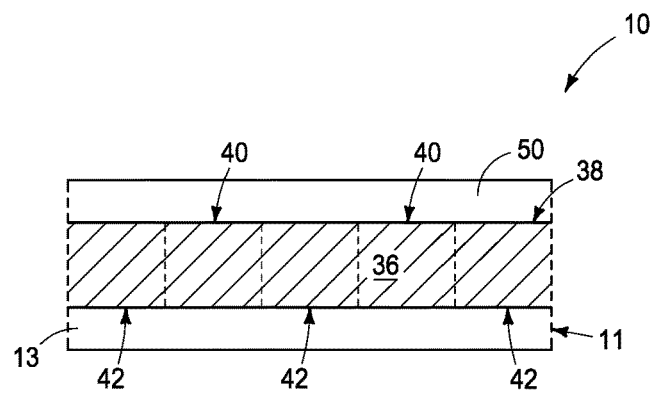
Figure 10:
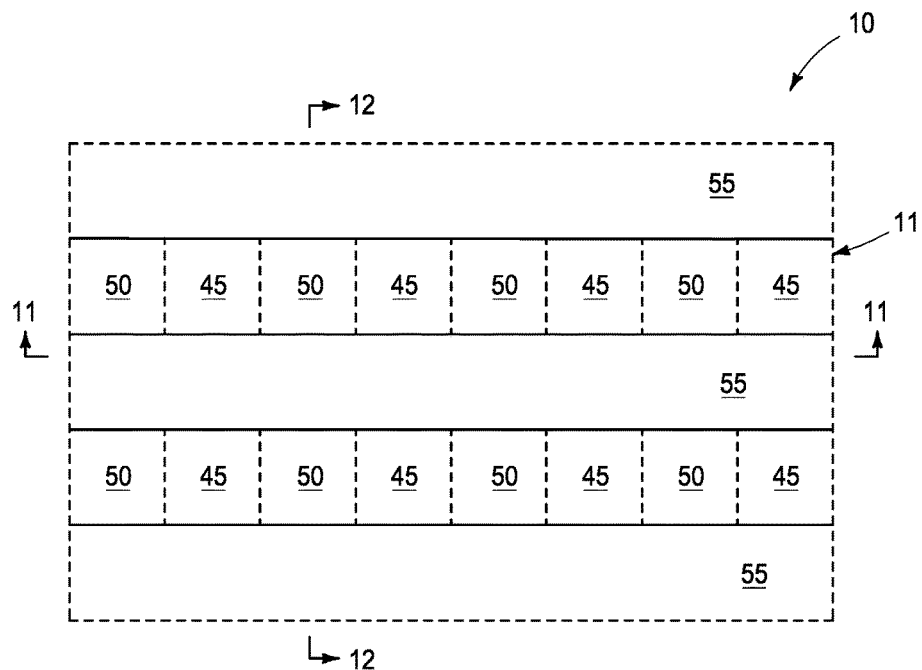
Figure 11:
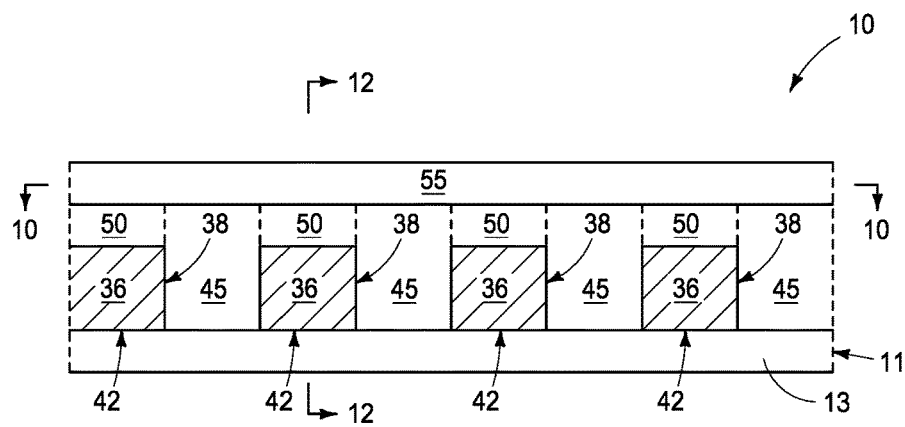
Figure 12:
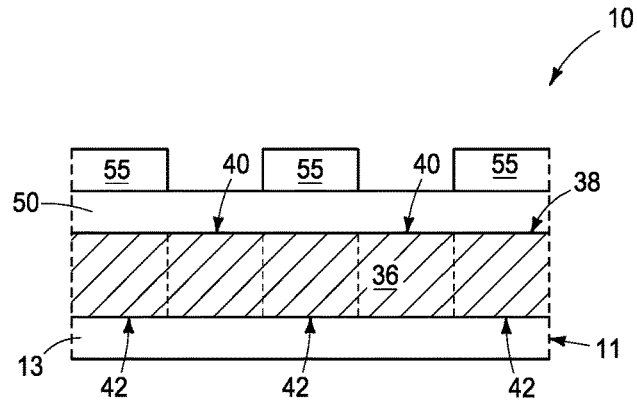
Figure 13:
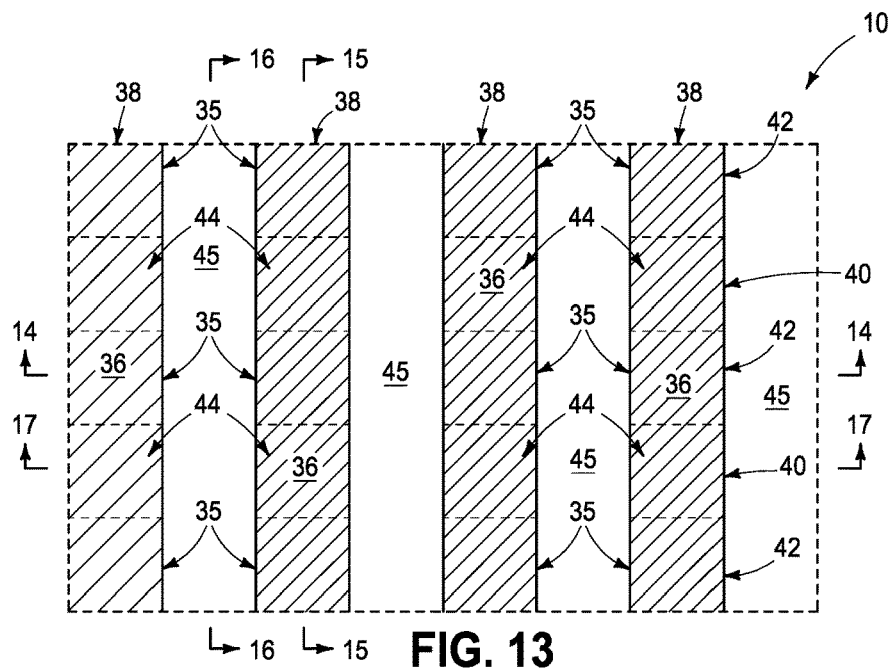
Figure 14:
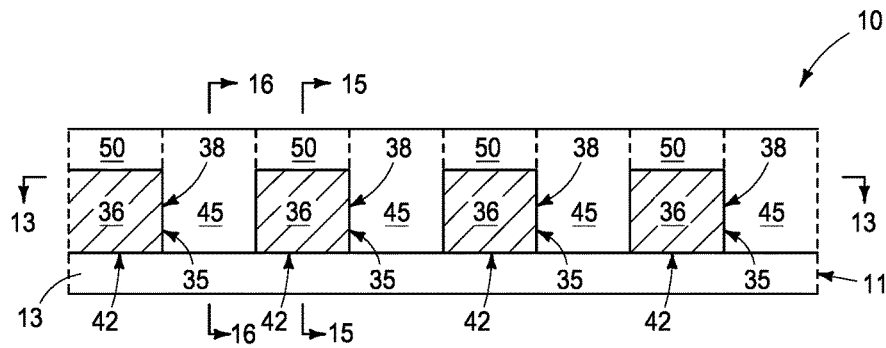
Figure 15:
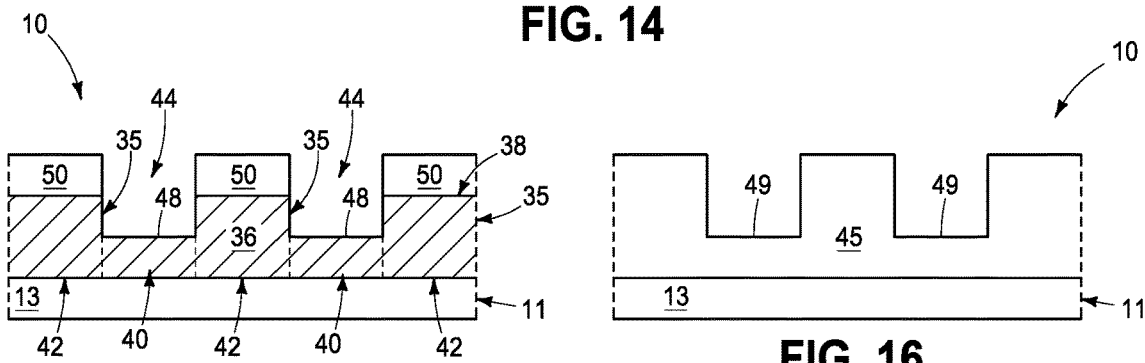
Figure 16:
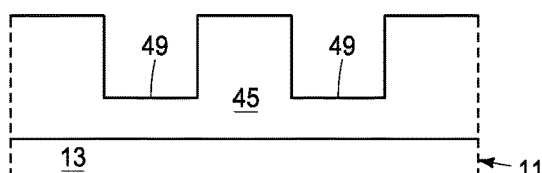
Figure 17:
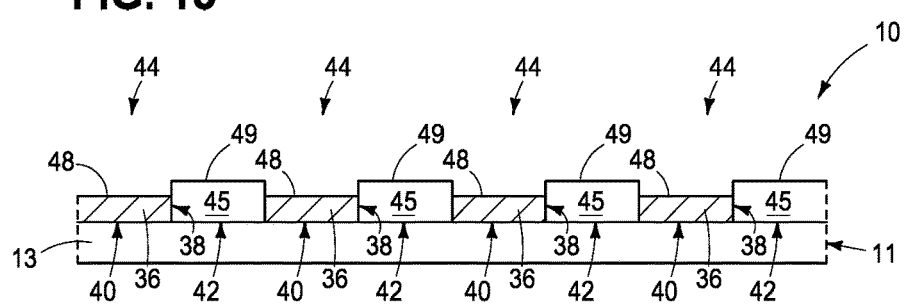
Figure 18:
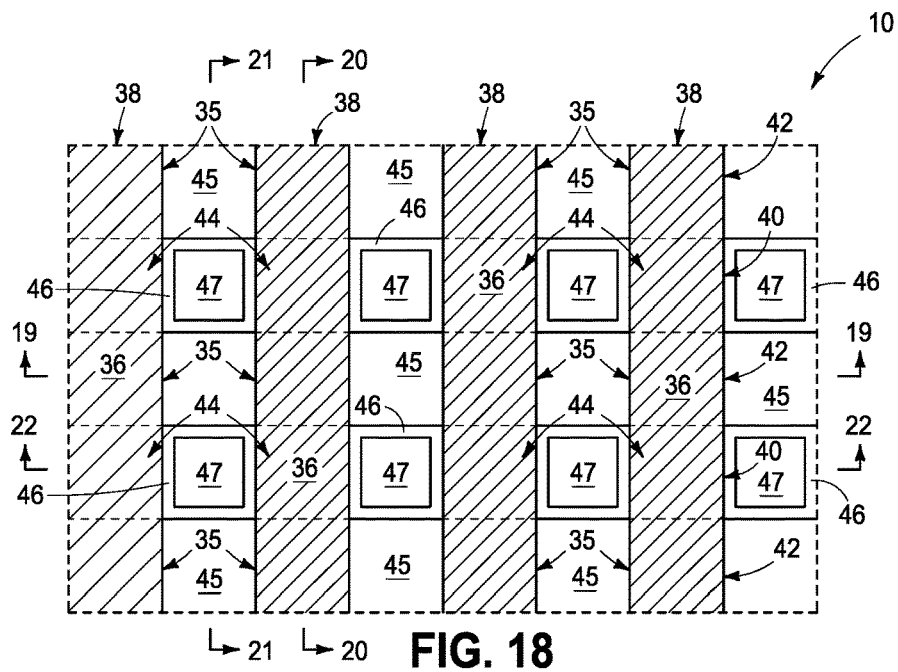

Referring to FIGS. 7-9, and in one embodiment, space that is laterally-between immediately-adjacent conductive lines 38 has been filled with insulative material 45 (e.g., silicon nitride and/or silicon dioxide). By way of example, such may be formed to initially overfill such spaces followed by planarizing insulative material 45 back at least to a top surface of insulator material 50. Insulative material 45 and insulator material 50 may be of same composition relative one another (exemplified by dashed interface lines therebetween) or may be of different compositions relative one another.

Conductive lines 38 individually may be considered as comprising longitudinally-spaced first regions 40 and longitudinally-spaced second regions 42 that longitudinally-alternate with longitudinally-spaced first regions 40 along individual conductive lines 38. Such regions may not be discernible at this point of processing. Regardless, referring to FIGS. 10-12 and in one embodiment, patterned masking material 55 has been formed atop the construction of FIGS. 7-9 to mask second regions 42 and leave first regions 40 exposed.

Referring to FIGS. 13-17, patterned masking material 55 (not shown) has been used as a mask while conducting, for example, a timed anisotropic etch into conductive material 36 to vertically recess conductive material 36 in longitudinally-spaced first regions 40 to form longitudinally-spaced conductive pillars 35 that individually are in individual longitudinally-spaced second regions 42. Example masking material 55 (not shown) has been removed during and/or after such example etching. Conductive pillars 35 project vertically relative to conductive material 36 in longitudinally-spaced and vertically-recessed first regions 40 of conductive lines 38. In one embodiment where insulator material 50 is present atop conductive material 36 and as shown, such has been removed from being atop conductive material 36 that is in longitudinally-spaced first regions 40 of the individual conductive lines 38 before such vertical recessing. Insulator material 50 (at least some of such) may remain atop conductive pillars 35 after their formation and, if so, may be in a finished construction of the integrated circuitry, for example as will be apparent in the continuing sequence of drawings in one embodiment. The above-described processing is but one example of vertically recessing conductive material 35 in longitudinally-spaced first regions 40 to form longitudinally-spaced conductive pillars 35. Any other existing or future-developed methods may be used.

In one embodiment, the vertically recessing forms tops 48 of conductive material 36 of conductive lines 38 in longitudinally-spaced first regions 40 to be lower than tops 49 of insulative material 45 that is laterally-between conductive lines 38 (FIG. 17), and in one embodiment with the space between conductive lines 38 having insulative material 45 therein during the forming of conductive pillars 35. The vertically recessing has formed void space 44 above longitudinally-spaced first regions 40 of conductive lines 38 longitudinally-between immediately-longitudinally-adjacent conductive pillars 35. In one embodiment, conductive material 36 of conductive pillars 35 of conductive lines 38, conductive material 36 of conductive lines 38 below conductive pillars 35, and conductive material 36 of conductive lines 38 in longitudinally-spaced first regions 40 are of the same composition relative one another. Such composition, by way of example only, may be homogenous or alternately non-homogenous, for example comprising multiple different composition layers (not shown).

Figure 19:
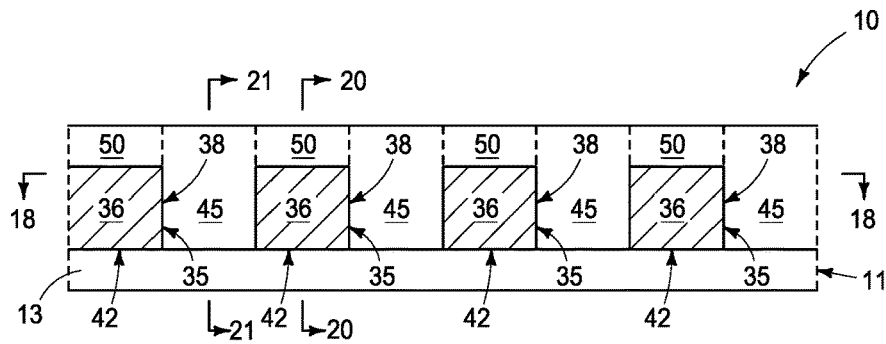
Figure 20:
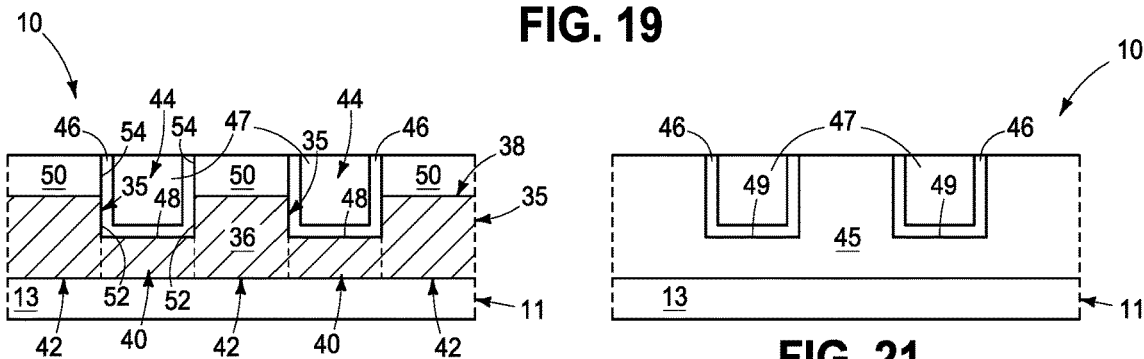
Figure 21:
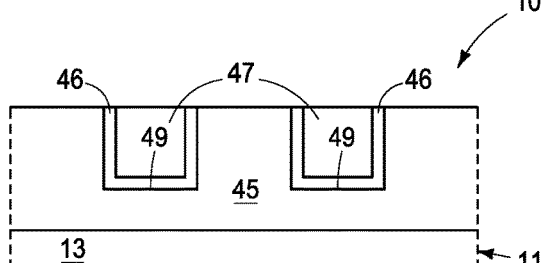
Figure 22:
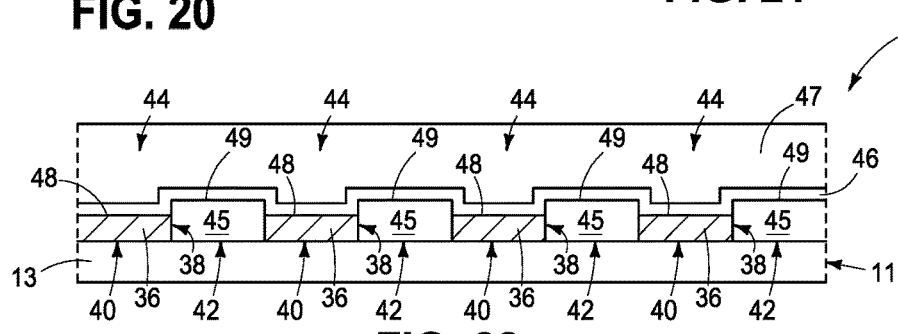

Referring to FIGS. 18-22, and in one embodiment, sidewalls of void space 44 have been lined with first insulating material 46 that less-than-fills void space 44, followed by filling remaining volume of void space 44 with second insulating material 47 that is of different composition from that of first insulating material 46. Such may be formed, for example, by first depositing a thin conformal layer of first insulating material 46, followed by formation of second insulating material 47, and followed by planarizing first insulating material 46 and second insulating material 47 back at least to a top surface of insulator material 50 as shown. By way of examples, first insulating material 46 may be silicon nitride or silicon dioxide and second insulating material 47 may be the other of silicon nitride or silicon dioxide. One example is first insulating material 46 being silicon nitride and second insulating material 47 being silicon dioxide that has been formed with spin-on-dielectric and subsequent densification thereof. Regardless, and in one embodiment as shown, sidewalk of void space 44 may be considered as comprising sidewalls 52 of conductive material 36 and sidewalls 54 of insulator material 50 that is atop conductive pillars 35 (FIG. 20). In such example, first insulating material 46 and second insulating material 47 are laterally over both of sidewalk 52 of conductive material 36 and sidewalk 54 of insulator material 50. Regardless, in one embodiment insulator material 50 and first insulating material 46 are of the same composition relative one another.

Figure 23:
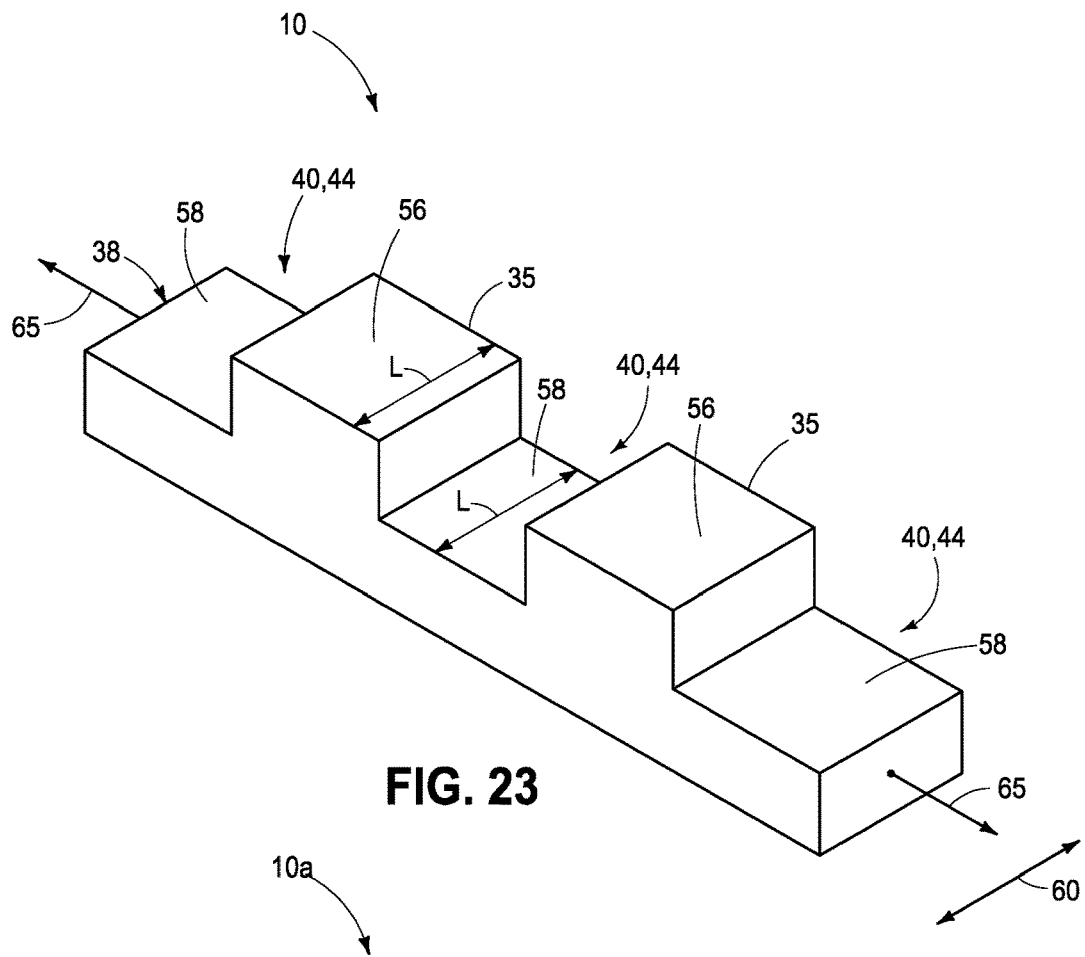

FIG. 23 is an enlarged perspective view of a portion of a single conductive line 38 having two pillars 35 as a part thereof, with other materials there-about having been removed for clarity. Individual conductive pillars 35 may be considered as having an uppermost conductive surface 56 and in one embodiment that is planar. Conductive material 36 of conductive line 38 in individual of longitudinally-spaced first regions 40 may be considered as having an uppermost conductive surface 58 and in one embodiment that is planar. In one embodiment, pillar-uppermost-conductive surface 56 and first-region-uppermost surface 58 are of the same maximum length L relative one another in a straight-line direction 60 (e.g., the cross-section that is FIG. 19 or 22) that is orthogonal to longitudinal orientation (e.g., that along a longitudinal axis 65) of the individual conductive line 38.

Any other attribute(s) or aspect(s) as shown and/or described herein with respect to other embodiments may be used in the embodiments shown and described with reference to the above embodiments.

Figure 24:
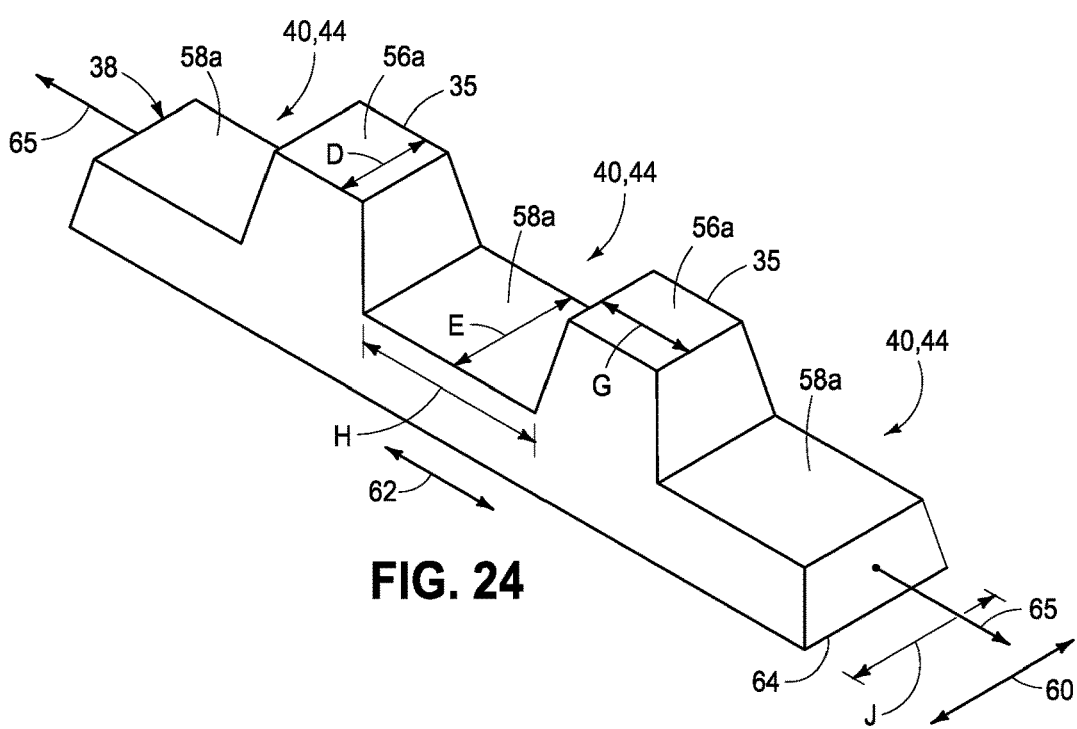
FIG. 24 shows alternate example methods and/or structural embodiments of the invention.

An alternate example embodiment is shown and described with reference to FIG. 24 with respect to a portion of a construction 10a. Like numerals from the above-described embodiments have been used where appropriate, with some construction differences being indicated with the suffix "a" or with different numerals or letters. In construction 10a, pillar uppermost conductive surface 56a has a maximum length D in straight-line direction 60 that is shorter than a maximum length Ii of first region uppermost conductive surface 58a in straight-line direction 60. In one embodiment, straight-line direction 60 may be considered as first straight-line direction 60 and construction 10a comprises a second straight-line direction 62 that is orthogonal to first straight-line direction 60. Pillar uppermost conductive surface 56a of individual conductive pillars 35 has a maximum length G in second straight-line direction 62 that is shorter than a maximum length H in second straight-line direction 62 of uppermost conductive surface 58a of conductive material 36 of conductive line 38 in individual longitudinally-spaced first regions 40. In one embodiment and as shown, conductive lines 38 individually have a bottom surface 64 that has a maximum length J in first straight-line direction 60 that is longer than maximum length E in first straight-line direction 60 of uppermost conductive surface 58a of conductive material 36 of individual conductive lines 38 in individual longitudinally-spaced first regions 40. The artisan is capable of selecting suitable anisotropic etching conditions that impact whether sidewalls in a subtractive etch, for example, are vertical or whether such taper from vertical. For example, varying one of more of temperature, pressure, or power in a plasma etch can be used to impact such, and which may be different for different chemistries. Any other attribute(s) or aspect(s) as shown and/or described herein with respect to other embodiments may be used.

Electronic components are formed directly above conductive pillars 35, with individual of the electronic components being directly electrically coupled to individual of conductive pillars 35. In one embodiment, the individual electronic components are directly against an uppermost conductive surface 56/56a of the individual conductive pillar to which the respective electronic component is directly electrically coupled. Any existing or future-developed electronic component(s) may be used. In one embodiment, the electronic components individually comprise a vertical transistor.

Figure 25:
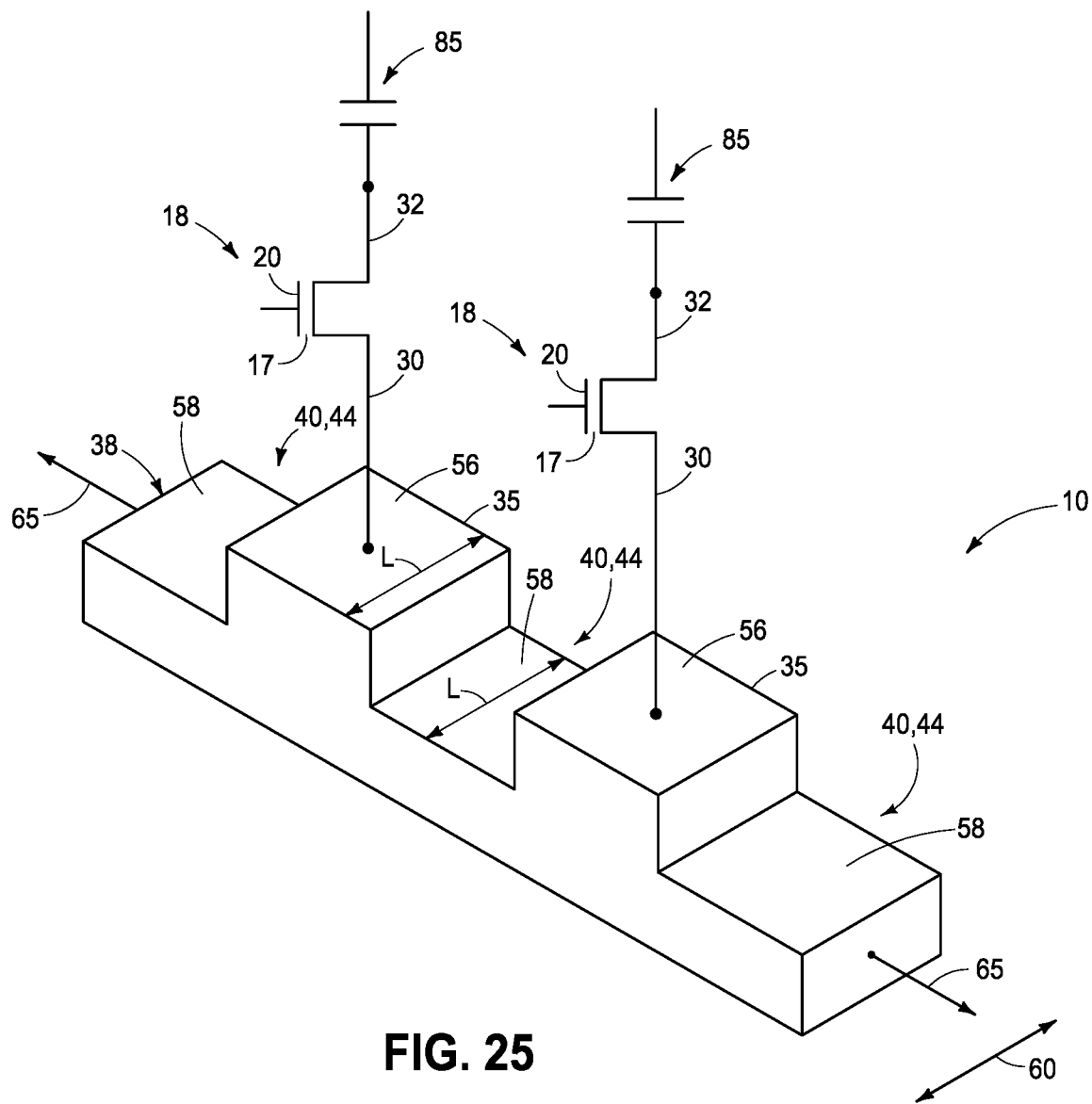

For example, and referring to FIG. 25, such shows an example embodiment wherein vertical transistors 18 are shown schematically as having been formed directly above and directly electrically coupled to individual conductive pillars 35 in construction 10. Such vertical transistors comprise a top source/drain region 32, a bottom source/drain region 30, and a channel region 15 vertically there-between. A conductive gate 20 and a gate insulator 17 are operably aside channel region 15. Example bottom source/drain region 30 is directly above and directly against an individual conductive pillar 35, for example directly against uppermost conductive surface 56. In one embodiment and as shown, for example in a method used in forming memory circuitry, a storage device 85 has been formed directly above and directly electrically coupled to top source/drain region 32, with an example storage device 85 being schematically depicted as a capacitor 85.

Figure 26:
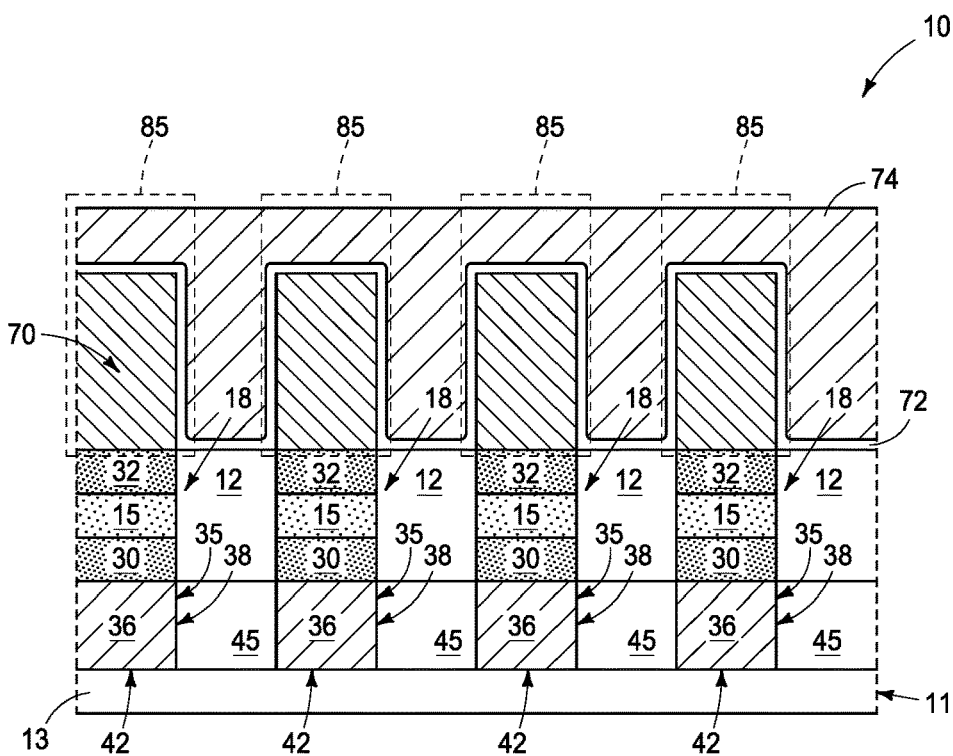
Figure 27:
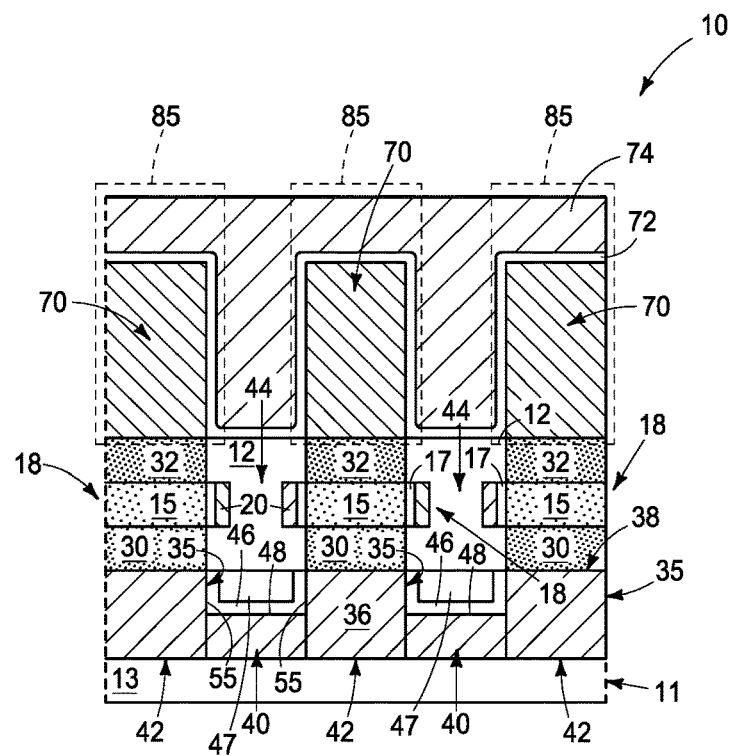

FIGS. 26 and 27 show, in but one example, more structure associated with FIGS. 19 and 20. For example, vertical transistors 18 that are referred to above are shown. Such are shown as being laterally separated by dielectric material 12 (e.g., silicon dioxide). Gates 20 and gate insulator 17 as shown are on opposing sides of channel regions 15. Gates 20 may comprise gate lines that interconnect transistors 18 along a row direction. Regions 32, 15, and 30 may be of any one or more suitable horizontal cross-sectional shapes, with square (as shown) or rectangular (not shown) being ideal at least for channel region 15 towards maximizing lateral overlap of gateline 20 with channel region 15. Capacitors 85 are shown individually directly electrically coupled to individual top source/drain regions 32 of individual vertical transistors 18. Such, by way of example, are shown as comprising a bottom capacitor electrode/storage node 70, a shared top capacitor electrode 74, and capacitor insulator 72 there-between. A single capacitor 85 and a single vertical transistor 18 directly there-below may comprise a single memory cell, for example of a one transistor-one capacitor DRAM cell of DRAM integrated circuitry.

Alternate embodiment constructions may result from method embodiments described above, or otherwise. Regardless, embodiments of the invention encompass integrated circuitry independent of method of manufacture. Nevertheless, such integrated circuitry may have any of the attributes as described herein in method embodiments. Likewise, the above-described method embodiments may incorporate, form, and/or have any of the attributes described with respect to device embodiments.

In one embodiment, integrated circuitry comprises a conductive line (e.g., 38) that is horizontally longitudinally elongated. The conductive line comprises longitudinally-spaced first regions (e.g., 40) that alternate with longitudinally-spaced second regions (e.g., 42) along the conductive line. The longitudinally-spaced second regions are characterized by a conductive pillar (e.g., 35) that projects vertically relative to conductive material (e.g., 36) of the conductive line in the longitudinally-spaced first regions. The conductive pillar has an uppermost conductive surface (e.g., 56a) and the conductive material of the conductive line in individual of the longitudinally-spaced first regions has an uppermost conductive surface (e.g., 58a). The uppermost conductive surface of the conductive pillar has a maximum length (e.g., D) in a straight-line direction (e.g., 60) that is orthogonal to longitudinal orientation (e.g., 62/65) of the conductive line that is shorter than a maximum length (e.g., E) of the uppermost conductive surface of the conductive material of the conductive line in the individual longitudinally-spaced first regions in the straight-line direction. Electronic components (e.g., 18) are directly above the conductive pillars. Individual of the electronic components are directly electrically coupled to individual of the conductive pillars. Any other attribute(s) or aspect(s) as shown and/or described herein with respect to other embodiments may be used.

In cine embodiment, memory circuitry comprises multiple conductive lines (e.g., 38) that are horizontally longitudinally elongated and laterally spaced from one another. Individual of the conductive lines comprise longitudinally-spaced first regions (e.g., 40) that alternate with longitudinally-spaced second regions (e.g., 42) along the individual conductive line. The longitudinally-spaced second regions are characterized by a conductive pillar (e.g., 35) that projects vertically relative to conductive material (e.g., 36) of the respective individual conductive line in the longitudinally-spaced first regions. The conductive pillar has an uppermost conductive surface (e.g., 56a) and the conductive material of the conductive line in individual of the longitudinally-spaced first regions has an uppermost conductive surface (e.g., 58a). The uppermost conductive surface of the conductive pillar has a maximum length (e.g., D) in a straight-line direction (e.g., 60) that is orthogonal to longitudinal orientation (e.g., 62/65) of the conductive line that is shorter than a maximum length (e.g., E) of the uppermost conductive surface of the conductive material of the respective conductive line in the individual longitudinally-spaced first regions in the straight-line direction. Vertical transistors (e.g., 18) are directly above the conductive pillars. Individual of the vertical transistors comprise a top source/drain region (e.g., 32), a bottom source/drain region (e.g., 30), and a channel region (e.g., 15) vertically between the top and bottom source/drain regions. The bottom source/drain region is directly above and directly against individual of the conductive pillars. A storage device (e.g., 85) is directly above and directly electrically coupled to the top source/drain region. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45" from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming integrated circuitry comprises forming conductive material over a substrate. The conductive material is patterned into a conductive line that is horizontally longitudinally elongated. The conductive material is vertically recessed in longitudinally-spaced first regions of the conductive line to form longitudinally-spaced conductive pillars that individually are in individual longitudinally-spaced second regions that longitudinally-alternate with the longitudinally-spaced first regions along the conductive line. The conductive pillars project vertically relative to the conductive material in the longitudinally-spaced and vertically-recessed first regions of the conductive line. Electronic components are formed directly above the conductive pillars. Individual of the electronic components are directly electrically coupled to individual of the conductive pillars.

In some embodiments, a method used in forming memory circuitry comprises forming conductive material over a substrate. The conductive material is patterned into multiple conductive lines that are horizontally longitudinally elongated and laterally spaced from one another. The conductive material is vertically recessed in longitudinally-spaced first regions of individual of the conductive lines to form longitudinally-spaced conductive pillars that individually are in individual longitudinally-spaced second regions that longitudinally-alternate with the longitudinally-spaced first regions along the individual conductive lines. The conductive pillars project vertically relative to the conductive material in the longitudinally-spaced and vertically-recessed first regions of the individual conductive lines. Vertical transistors are formed directly above the conductive pillars. Individual of the vertical transistors comprise a top source/drain region, a bottom source/drain region, and a channel region vertically between the top and bottom source/drain regions. The bottom source/drain region is directly above and directly against individual of the conductive pillars. A storage device is formed directly above and directly electrically coupled to the top source/drain region.

In some embodiments, integrated circuitry comprises a conductive line that is horizontally longitudinally elongated. The conductive line comprises longitudinally-spaced first regions that alternate with longitudinally-spaced second regions along the conductive line. The longitudinally-spaced second regions are characterized by a conductive pillar that projects vertically relative to conductive material of the conductive line in the longitudinally-spaced first regions. The conductive pillar has an uppermost conductive surface and the conductive material of the conductive line in individual of the longitudinally-spaced first regions has an uppermost conductive surface. The uppermost conductive surface of the conductive pillar has a maximum length in a straight-line direction that is orthogonal to longitudinal orientation of the conductive line that is shorter than a maximum length of the uppermost conductive surface of the conductive material of the conductive line in the individual longitudinally-spaced first regions in the straight-line direction. Electronic components are directly above the conductive pillars. Individual of the electronic components are directly electrically coupled to individual of the conductive pillars.

In some embodiments, memory circuitry comprises multiple conductive lines that are horizontally longitudinally elongated and laterally spaced from one another. Individual of the conductive lines comprise longitudinally-spaced first regions that alternate with longitudinally-spaced second regions along the individual conductive line. The longitudinally-spaced second regions are characterized by a conductive pillar that projects vertically relative to conductive material of the respective individual conductive line in the longitudinally-spaced first regions. The conductive pillar has an uppermost conductive surface and the conductive material of the conductive line in individual of the longitudinally-spaced first regions has an uppermost conductive surface. The uppermost conductive surface of the conductive pillar has a maximum length in a straight-line direction that is orthogonal to longitudinal orientation of the conductive line that is shorter than a maximum length of the uppermost conductive surface of the conductive material of the respective conductive line in the individual longitudinally-spaced first regions in the straight-line direction. Vertical transistors are directly above the conductive pillars. Individual of the vertical transistors comprise a top source/drain region, a bottom source/drain region, and a channel region vertically between the top and bottom source/drain regions. The bottom source/drain region is directly above and directly against individual of the conductive pillars. A storage device is directly above and directly electrically coupled to the top source/drain region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming integrated circuitry, comprising:
   forming conductive material over a substrate;
   patterning the conductive material into a conductive line that is horizontally longitudinally elongated;
   vertically recessing the conductive material in longitudinally-spaced first regions of the conductive line to form longitudinally-spaced conductive pillars that individually are in individual longitudinally-spaced second regions that longitudinally-alternate with the longitudinally-spaced first regions along the conductive line, the conductive pillars projecting vertically relative to the conductive material in the longitudinally-spaced and vertically-recessed first regions of the conductive line;
   forming electronic components directly above the conductive pillars, individual of the electronic components being directly electrically coupled to individual of the conductive pillars;
   the vertically recessing forming void space above the longitudinally-spaced first regions of the conductive line longitudinally-between immediately-longitudinally-adjacent of the conductive pillars; and
   further comprising:
      lining sidewalls of the void space with first insulating material that less-than-fills the void space; and
      filling remaining volume of the void space with second insulating material that is of different composition from that of the first insulating material.

2. A method used in forming integrated circuitry, comprising:
   forming conductive material over a substrate;
   patterning the conductive material into a conductive line that is horizontally longitudinally elongated;
   vertically recessing the conductive material in longitudinally-spaced first regions of the conductive line to form longitudinally-spaced conductive pillars that individually are in individual longitudinally-spaced second regions that longitudinally-alternate with the longitudinally-spaced first regions along the conductive line, the conductive pillars projecting vertically relative to the conductive material in the longitudinally-spaced and vertically-recessed first regions of the conductive line;
   forming electronic components directly above the conductive pillars, individual of the electronic components being directly electrically coupled to individual of the conductive pillars;
   the patterning forming multiple of said conductive lines that are laterally spaced relative one another; and
   the vertically recessing, the forming of said longitudinally-spaced conductive pillars, and the forming of said electronic components occurring with respect to the multiple of said conductive lines.

3. The method of claim 2 comprising filling space that is laterally-between immediately-adjacent of said conductive lines with insulative material prior to forming the conductive pillars, the space having the insulative material therein during the forming of the conductive pillars.

4. The method of claim 3 wherein the vertically recessing forms tops of the conductive material of the conductive lines in the longitudinally-spaced first regions to be lower than tops of the insulative material that is laterally-between the conductive lines.

5. The method of claim 3 comprising:
   forming insulator material atop the conductive material prior to forming the conductive pillars;
   removing the insulator material from being atop the conductive material that is in the longitudinally-spaced first regions of the conductive line before the vertically recessing; and
   the insulator material remaining atop the conductive pillars after their formation and in a finished construction of the integrated circuitry.

6. The method of claim 5 comprising forming the insulator material atop the conductive material prior to forming the conductive line.

7. The method of claim 5 wherein the vertically recessing forms void space above the longitudinally-spaced first regions of the conductive lines longitudinally-between immediately-longitudinally-adjacent of the conductive pillars; and
   further comprising:
      lining sidewalls of the void space with first insulating material that less-than-fills the void space; and
      filling remaining volume of the void space with second insulating material that is over the first insulating material and that is of different composition from that of the first insulating material.

8. The method of claim 7 wherein the sidewalls of the void space comprise sidewalls of the conductive material and sidewalls of the insulator material atop the conductive pillars, the first insulating material and the second insulating material be laterally over both of the sidewalls of the conductive material and the sidewalls of the insulator material.

9. The method of claim 7 wherein the insulator material and the first insulating material are of the same composition relative one another.

10. A method used in forming integrated circuitry, comprising:
    forming conductive material over a substrate;
    patterning the conductive material into a conductive line that is horizontally longitudinally elongated;
    vertically recessing the conductive material in longitudinally-spaced first regions of the conductive line to form longitudinally-spaced conductive pillars that individually are in individual longitudinally-spaced second regions that longitudinally-alternate with the longitudinally-spaced first regions along the conductive line, the conductive pillars projecting vertically relative to the conductive material in the longitudinally-spaced and vertically-recessed first regions of the conductive line;
    forming electronic components directly above the conductive pillars, individual of the electronic components being directly electrically coupled to individual of the conductive pillars;
    the individual conductive pillars having an uppermost conductive surface and the conductive material of the conductive line in individual of the longitudinally-spaced first regions having an uppermost conductive surface; and the uppermost conductive surface of the individual conductive pillars and the uppermost conductive surface of the conductive material of the conductive line in the individual longitudinally-spaced first regions being of the same maximum length relative one another in a straight-line direction that is orthogonal to longitudinal orientation of the conductive line.

11. A method used in forming integrated circuitry, comprising:

forming conductive material over a substrate;
patterning the conductive material into a conductive line that is horizontally longitudinally elongated;
vertically recessing the conductive material in longitudinally-spaced first regions of the conductive line to form longitudinally-spaced conductive pillars that individually are in individual longitudinally-spaced second regions that longitudinally-alternate with the longitudinally-spaced first regions along the conductive line, the conductive pillars projecting vertically relative to the conductive material in the longitudinally-spaced and vertically-recessed first regions of the conductive line;
forming electronic components directly above the conductive pillars, individual of the electronic components being directly electrically coupled to individual of the conductive pillars;
the individual conductive pillars having an uppermost conductive surface and the conductive material of the conductive line in individual of the longitudinally-spaced first regions having an uppermost conductive surface; and
the uppermost conductive surface of the individual conductive pillars having a maximum length in a straight-line direction that is orthogonal to longitudinal orientation of the conductive line that is shorter than a maximum length of the uppermost conductive surface of the conductive material of the conductive line in the individual longitudinally-spaced first regions in the straight-line direction;
said straight-line direction is a first straight-line direction and comprising a second straight-line direction that is orthogonal to the first straight-line direction; and
the uppermost conductive surface of the individual conductive pillars having a maximum length in the second straight-line direction that is shorter than a maximum length in the second straight-line direction of the uppermost conductive surface of the conductive material of the conductive line in the individual longitudinally-spaced first regions.

12. The method of claim 11 wherein the conductive line has a bottom surface that has a maximum length in the first straight-line direction that is longer than the maximum length in the first straight-line direction of the uppermost conductive surface of the conductive material of the conductive line in the individual longitudinally-spaced first regions.

13. A method used in forming integrated circuitry, comprising:

forming conductive material over a substrate;
patterning the conductive material into a conductive line that is horizontally longitudinally elongated;
vertically recessing the conductive material in longitudinally-spaced first regions of the conductive line to form longitudinally-spaced conductive pillars that individually are in individual longitudinally-spaced second regions that longitudinally-alternate with the longitudinally-spaced first regions along the conductive line, the conductive pillars projecting vertically relative to the conductive material in the longitudinally-spaced and vertically-recessed first regions of the conductive line;
forming electronic components directly above the conductive pillars, individual of the electronic components being directly electrically coupled to individual of the conductive pillars; and
the individual electronic components comprising a vertical transistor.

14. A method used in forming memory circuitry, comprising:

forming conductive material over a substrate;
patterning the conductive material into multiple conductive lines that are horizontally longitudinally elongated and laterally spaced from one another;
vertically recessing the conductive material in longitudinally-spaced first regions of individual of the conductive lines to form longitudinally-spaced conductive pillars that individually are in individual longitudinally-spaced second regions that longitudinally-alternate with the longitudinally-spaced first regions along the individual conductive lines, the conductive pillars projecting vertically relative to the conductive material in the longitudinally-spaced and vertically-recessed first regions of the individual conductive lines;
forming vertical transistors directly above the conductive pillars; individual of the vertical transistors comprising a top source/drain region, a bottom source/drain region, and a channel region vertically between the top and bottom source/drain regions; the bottom source/drain region being directly above and directly against individual of the conductive pillars; and
forming a storage device directly above and directly electrically coupled to the top source/drain region.

15. The method of claim 14 wherein the memory circuitry comprises DRAM.

16. Integrated circuitry, comprising:

multiple conductive lines that are horizontally longitudinally elongated and laterally spaced from one another, individual of the conductive lines comprising longitudinally-spaced first regions that alternate with longitudinally-spaced second regions along the respective individual conductive line, the longitudinally-spaced second regions being characterized by a conductive pillar that projects vertically relative to conductive material of the respective individual conductive line in the longitudinally-spaced first regions;
the conductive pillar having an uppermost conductive surface and the conductive material of the respective individual conductive line in individual of the longitudinally-spaced first regions having an uppermost conductive surface;
the uppermost conductive surface of the conductive pillar having a maximum length in a straight-line direction that is orthogonal to longitudinal orientation of the respective individual conductive line that is shorter than a maximum length of the uppermost conductive surface of the conductive material of the respective individual conductive line in the individual longitudinally-spaced first regions in the straight-line direction; and electronic components directly above the conductive pillars, individual of the electronic components being directly electrically coupled to individual of the conductive pillars.

17. Memory circuitry comprising:
multiple conductive lines that are horizontally longitudinally elongated and laterally spaced from one another, individual of the conductive lines comprising longitudinally-spaced first regions that alternate with longitudinally-spaced second regions along the respective individual conductive line, the longitudinally-spaced second regions being characterized by a conductive pillar that projects vertically relative to conductive material of the respective individual conductive line in the longitudinally-spaced first regions;
the conductive pillar having an uppermost conductive surface and the conductive material of the respective individual conductive line in individual of the longitudinally-spaced first regions having an uppermost conductive surface;
the uppermost conductive surface of the conductive pillar having a maximum length in a straight-line direction that is orthogonal to longitudinal orientation of the respective individual conductive line that is shorter than a maximum length of the uppermost conductive surface of the conductive material of the respective individual conductive line in the individual longitudinally-spaced first regions in the straight-line direction;
vertical transistors directly above the conductive pillars; individual of the vertical transistors comprising a top source/drain region, a bottom source/drain region, and a channel region vertically between the top and bottom source/drain regions; the bottom source/drain region being directly above and directly against individual of the conductive pillars; and
a storage device directly above and directly electrically coupled to the top source/drain region.

18. The memory circuitry of claim 17 wherein the individual electronic components are directly against an uppermost surface of the top source/drain region to which the respective storage device is directly electrically coupled.

19. The memory circuitry of claim 17 wherein the conductive material of the conductive pillars of the conductive lines, the conductive material of the conductive lines below the conductive pillars, and the conductive material of the conductive lines in the longitudinally-spaced first regions are of the same composition relative one another.

20. The memory circuitry of claim 17 comprising void space above the longitudinally-spaced first regions of the individual conductive lines longitudinally-between immediately-longitudinally-adjacent of the conductive pillars; and further comprising:
a first insulating material lining sidewalls of and less than filling the void space; and
second insulating material of different composition from that of the first insulating material radially inside of the first insulating material.

21. The memory circuitry of claim 17 wherein the storage device is a capacitor of an individual memory cell comprising the capacitor and the respective vertical transistor to which the capacitor is directly coupled to its top source/drain region.

22. The memory circuitry of claim 21 wherein the individual memory cells are a one transistor, one-capacitor memory cell of DRAM.

23. The memory circuitry of claim 17 wherein,
said straight-line direction is a first straight-line direction and comprising a second straight-line direction that is orthogonal to the first straight-line direction; and
the uppermost conductive surface of the individual conductive pillars having a maximum length in the second straight-line direction that is shorter than a maximum length in the second straight-line direction of the uppermost conductive surface of the conductive material of the conductive line in the individual longitudinally spaced first regions.

24. The memory circuitry of claim 23 wherein the conductive line has a bottom surface that has a maximum length in the first straight-line direction that is longer than the maximum length in the first straight-line direction of the uppermost conductive surface of the conductive material of the conductive line in the individual longitudinally-spaced first regions.

25. The memory circuitry of claim 24 wherein the storage device is a capacitor of an individual memory cell comprising the capacitor and the respective vertical transistor to which the capacitor is directly coupled to its top source/drain region, the individual memory cells being a one transistor, one-capacitor memory cell of DRAM.

26. Integrated circuitry, comprising:
a conductive line that is horizontally longitudinally elongated, the conductive line comprising longitudinally-spaced first regions that alternate with longitudinally-spaced second regions along the conductive line, the longitudinally-spaced second regions being characterized by a conductive pillar that projects vertically relative to conductive material of the conductive line in the longitudinally-spaced first regions;
the conductive pillar having an uppermost conductive surface and the conductive material of the conductive line in individual of the longitudinally-spaced first regions having an uppermost conductive surface;
the uppermost conductive surface of the conductive pillar having a maximum length in a straight-line direction that is orthogonal to longitudinal orientation of the conductive line that is shorter than a maximum length of the uppermost conductive surface of the conductive material of the conductive line in the individual longitudinally-spaced first regions in the straight-line direction;
electronic components directly above the conductive pillars, individual of the electronic components being directly electrically coupled to individual of the conductive pillars;
void space above the longitudinally-spaced first regions of the conductive line longitudinally-between immediately-longitudinally-adjacent of the conductive pillars; and
further comprising:
a first insulating material lining sidewalls of and less-than-filling the void space; and
second insulating material of different composition from that of the first insulating material radially inside of the first insulating material.

27. Integrated circuitry, comprising:
a conductive line that is horizontally longitudinally elongated, the conductive line comprising longitudinally-spaced first regions that alternate with longitudinally-spaced second regions along the conductive line, the longitudinally-spaced second regions being characterized by a conductive pillar that projects vertically relative to conductive material of the conductive line in the longitudinally-spaced first regions;

the conductive pillar having an uppermost conductive surface and the conductive material of the conductive line in individual of the longitudinally-spaced first regions having an uppermost conductive surface;

the uppermost conductive surface of the conductive pillar having a maximum length in a straight-line direction that is orthogonal to longitudinal orientation of the conductive line that is shorter than a maximum length of the uppermost conductive surface of the conductive material of the conductive line in the individual longitudinally-spaced first regions in the straight-line direction; and electronic components directly above the conductive pillars, individual of the electronic components being directly electrically coupled to individual of the conductive pillars said straight-line direction is a first straight-line direction and comprising a second straight-line direction that is orthogonal to the first straight-line direction; and the uppermost conductive surface of the individual conductive pillars having a maximum length in the second straight-line direction that is shorter than a maximum length in the second straight-line direction of the uppermost conductive surface of the conductive material of the conductive line in the individual longitudinally-spaced first regions; and the conductive line having a bottom surface that has a maximum length in the first straight-line direction that is longer than the maximum length in the first straight-line direction of the uppermost conductive surface of the conductive material of the conductive line in the individual longitudinally-spaced first regions.

28. Integrated circuitry, comprising:

a conductive line that is horizontally longitudinally elongated, the conductive line comprising longitudinally-spaced first regions that alternate with longitudinally-spaced second regions along the conductive line, the longitudinally-spaced second regions being characterized by a conductive pillar that projects vertically relative to conductive material of the conductive line in the longitudinally-spaced first regions;

the conductive pillar having an uppermost conductive surface and the conductive material of the conductive line in individual of the longitudinally-spaced first regions having an uppermost conductive surface;

the uppermost conductive surface of the conductive pillar having a maximum length in a straight-line direction that is orthogonal to longitudinal orientation of the conductive line that is shorter than a maximum length of the uppermost conductive surface of the conductive material of the conductive line in the individual longitudinally-spaced first regions in the straight-line direction;

electronic components directly above the conductive pillars, individual of the electronic components being directly electrically coupled to individual of the conductive pillars, the individual electronic components comprising a vertical transistor.

* * * * *